(12) United States Patent
Toshima et al.

(10) Patent No.: US 9,076,643 B2
(45) Date of Patent: Jul. 7, 2015

(54) SUPERCRITICAL PROCESSING APPARATUS, SUBSTRATE PROCESSING SYSTEM AND SUPERCRITICAL PROCESSING METHOD

(75) Inventors: Takayuki Toshima, Koshi (JP); Kazuo Terada, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 639 days.

(21) Appl. No.: 12/652,794

(22) Filed: Jan. 6, 2010

(65) Prior Publication Data

US 2011/0000507 A1   Jan. 6, 2011

(30) Foreign Application Priority Data

Jul. 1, 2009   (JP) ................................. 2009-001786

(51) Int. Cl.
*H01L 21/02*   (2006.01)

(52) U.S. Cl.
CPC .... *H01L 21/02057* (2013.01); *H01L 21/02101* (2013.01)

(58) Field of Classification Search
CPC ..................... H01L 21/02101; H01L 21/02057
USPC .............................................. 134/105, 902
See application file for complete search history.

(56) References Cited

U.S. PATENT DOCUMENTS

| | | | |
|---|---|---|---|
| 1,939,836 A | * | 12/1933 | Tolfree ........................ 134/102.1 |
| 6,742,279 B2 | * | 6/2004 | Lubomirsky et al. ........... 34/317 |
| 2002/0160625 A1 | * | 10/2002 | Inoue et al. .................... 438/780 |

FOREIGN PATENT DOCUMENTS

| | | |
|---|---|---|
| JP | 2001-313328 A | 11/2001 |
| JP | 9-232271 A | 4/2002 |
| JP | 2005-000853 A | 1/2005 |
| JP | 2007-049065 A | 2/2007 |

* cited by examiner

*Primary Examiner* — David Cormier
(74) *Attorney, Agent, or Firm* — Abelman, Frayne & Schwab

(57) ABSTRACT

Disclosed is a supercritical processing apparatus which can suppress the occurrence of pattern collapse, improve the throughput, and prolong a maintenance interval. In the disclosed supercritical processing apparatus to remove a liquid remained on a substrate by a super-critical state processing fluid, a heating unit heats the processing fluid to place the processing fluid into a processing receptacle in a supercritical state, and a cooling mechanism forcibly cools an area capable of transferring the heat to the substrate from the heating unit in order to suppress the liquid from being evaporated from the substrate until the substrate is disposed on a seating unit.

8 Claims, 12 Drawing Sheets

SUPERCRITICAL PROCESSING APPARATUS, SUBSTRATE PROCESSING SYSTEM AND SUPERCRITICAL PROCESSING METHOD

This application is based on and claims priority from Japanese Patent Application No. 2009-001786, filed on Jan. 7, 2009, with the Japanese Patent Office, the disclosure of which is incorporated herein in its entirety by reference.

TECHNICAL FIELD

The present disclosure relates to a technology of performing supercritical processing on the substrate after performing liquid processing, such as washing, on a surface-patterned substrate (e.g., a semiconductor wafer).

BACKGROUND

A semiconductor device fabrication process for forming a layered structure of an integrated circuit on the surface of a substrate, for example, a semiconductor wafer (hereinafter, referred to as a wafer), includes a liquid processing process for removing fine particles or a natural oxide film on the surface of the wafer by a chemical liquid and the like.

A single-wafer type spin washing apparatus, as a liquid processing apparatus used for the liquid processing process, removes particles or a natural oxide film on the surface of a wafer by rotating the wafer while supplying an alkaline or acidic liquid to the surface of the wafer by a nozzle. In this case, the liquid which remains in the surface of the wafer is removed through spin-drying by rotating the wafer after a rinsing process performed by pure water and the like.

However, as a semiconductor device is highly integrated, a problem of so-called pattern collapse has become serious in the process of removing such a liquid. The pattern collapse indicates a phenomenon where in drying of the liquid which remains in the surface of the wafer, when the liquid which remains on the left and right sides of a projection portion of a pattern forming unevenness is non-uniformly dried, the balance of leftward/rightward surface tension on the projection portion is collapsed, and thereby the projection portion is collapsed in the direction of the liquid which remains in a larger amount.

As a method for removing the liquid which remains on the surface of a wafer and inhibiting such pattern collapse, there has been known a drying method using a supercritical-state fluid (supercritical fluid). A supercritical fluid has a lower viscosity, compared to a liquid, and also has a high liquid-solubility. Besides, in the supercritical fluid, there exists no interface between liquid-gas. Accordingly, when a wafer with a liquid remained thereon comes in contact with the supercritical fluid, and the liquid on a wafer surface is dissolved in the supercritical fluid, it is possible to dry the liquid without an influence of surface tension.

Herein, the supercritical state requires a high temperature and high pressure condition. The inventors of the present disclosure have examined a method for performing a liquid drying processing by using a supercritical fluid (hereinafter, referred to as supercritical drying). In the method, after washing of a wafer by a liquid, the wafer with the liquid remained thereon is loaded in a processing chamber, a fluid (in a liquid state at room temperature) is supplied into the processing chamber, the processing chamber is tightly closed, and then a supercritical fluid is obtained by heating the fluid.

As shown in FIG. 1 and paragraph [0033] of Japanese Laid-Open Patent Publication HEI. No. 9-232271, the fluid supplied into the processing chamber is heated by a heater (such as a heating resistor) to be placed in a supercritical state, in which the heater is provided in a seating unit on which a wafer is seated. However, during the loading of the wafer, when the temperature of the atmosphere within the processing chamber or the region where the wafer is disposed is high, the liquid is naturally dried, and thereby pattern collapse occurs before the start of supercritical drying.

Therefore, when the wafer is loaded into the processing chamber, the temperature of the atmosphere within the processing chamber or the region where the wafer is disposed is required to be lowered. However, if the heater is turned off in a period of time other than the period of time for heating a fluid, the fluid is required to be heated again. Thus, a time required for obtaining a supercritical fluid is prolonged, thereby reducing the throughput of a device. Also, the on/off conversion of the heater according to the performance of each supercritical drying process facilitates the deterioration of a switch of the heater or the heater itself, thereby causing a problem in that a maintenance interval is shortened.

SUMMARY

According to one embodiment, there is provided a supercritical processing apparatus to dispose a substrate with a liquid remained on the substrate on a seating unit within a processing receptacle, and remove the liquid remained on the substrate by a supercritical-state processing fluid. The apparatus includes a processing fluid supply unit to supply the processing fluid into the processing receptacle, a heating unit to heat the processing fluid supplied into the processing receptacle in order to place the processing fluid in a supercritical state, and a heat-transfer suppressing mechanism to suppress heat transfer from the heating unit to the substrate in order to prevent the liquid from evaporating from the substrate until the processing fluid is supplied to the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
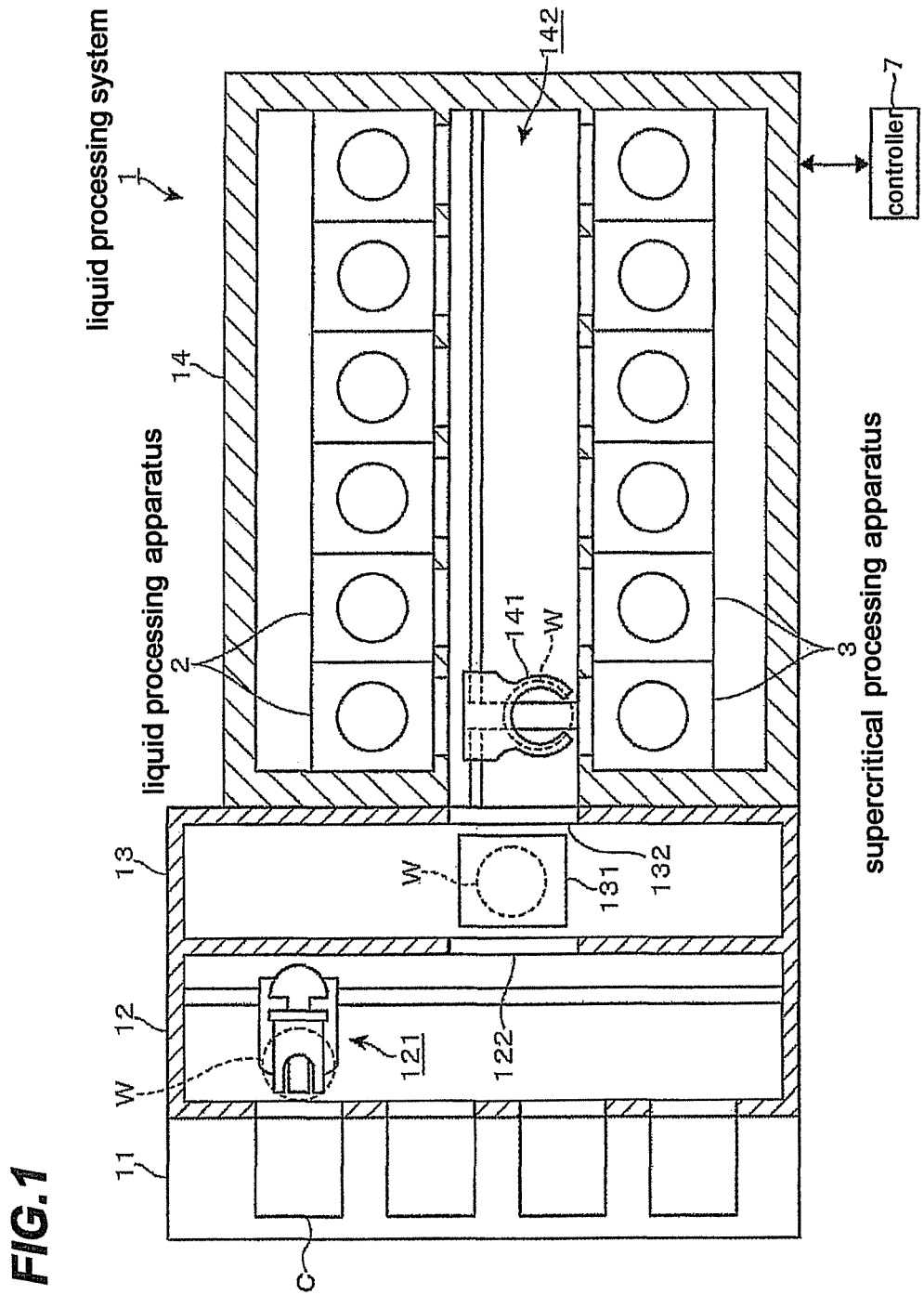
FIG. 1 is a cross-sectional plan view illustrating the entire configuration of a liquid processing system according to one embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure provides a supercritical processing apparatus to suppress the occurrence of pattern collapse, improve the throughput, and prolong the maintenance interval, a substrate processing system with the same, and a supercritical processing method.

According to one embodiment, there is provided a supercritical processing apparatus to dispose a substrate with a liquid remained thereon on a seating unit within a processing receptacle, and remove the liquid remained on the substrate by a supercritical-state processing fluid. The apparatus includes a processing fluid supply unit to supply the processing fluid into the processing receptacle, a heating unit to heat the processing fluid supplied into the processing receptacle in order to place the processing fluid in a supercritical state, and a heat-transfer suppressing mechanism to suppress heat transfer from the heating unit to the substrate in order to prevent the liquid from evaporating from the substrate until the processing fluid is supplied to the substrate.

In the supercritical processing apparatus, the heat-transfer suppressing mechanism may be a cooling mechanism to forcibly cool an area transferring the heat from the heating unit to the substrate.

The heating unit may be provided below a disposition surface of the seating unit, and the heat-transfer suppressing mechanism may be used as a heat-transfer state converting mechanism. The heat-transfer state converting mechanism converts a heat-transfer state of a heat-transfer surface between the disposition surface and the heating unit into a first state for heating the processing fluid by the heating unit during processing on the substrate, and converts the heat-transfer state into a second state for preventing the liquid from evaporating from the substrate from completion of the processing on the substrate to disposition of another substrate on the seating unit, wherein the heat transfer rate in the second state is lower than the heat transfer rate in the first state.

The heat-transfer state converting mechanism may include a fluid path within the seating unit, a refrigerant supply unit to supply a refrigerant to the fluid path to convert the heat-transfer state into the second state, and a purge fluid supply unit to supply a purge fluid having a specific heat lower than the refrigerant to the fluid path to convert the heat-transfer state into the first state.

The purge fluid supply unit may fill the fluid path with the purge fluid, and then stop through-flow of the purge fluid.

In order to convert the heat-transfer state into the second state, instead of the refrigerant supply unit, a vacuum exhausting unit to vacuum-exhaust the fluid path may be provided.

The conversion from the second state into the first state may be performed after the processing fluid supplied from the processing fluid supply unit into the processing receptacle is reservoired up to a level higher than an upper surface of the substrate disposed on the seating unit.

According to a second embodiment, there is provided a substrate processing system including a liquid processing apparatus to supply a chemical liquid to a surface of a substrate and wash the surface, the above described supercritical processing apparatus to perform processing on the substrate loaded into a processing receptacle from the liquid processing apparatus by a supercritical-state processing fluid, and a substrate carrying device to carry the substrate between the liquid processing apparatus and the supercritical processing apparatus.

According to a third embodiment, there is provided a supercritical processing method including forcible cooling a disposition surface of a seating unit within a processing receptacle, loading a substrate with a liquid remained thereon into the processing receptacle to dispose the substrate on the forcibly cooled disposition surface, tightly closing the processing receptacle, and supplying a processing fluid to a surface of the substrate, stopping the forcible cooling, and heating the disposition surface by a heating unit provided below the disposition surface, thereby placing the processing fluid in a supercritical state and removing the liquid.

In this method, the heating of the processing fluid by the heating unit is to set a heat-transfer state between the disposition surface and the heating unit as a first state, and the forcible cooling of the disposition surface of the seating unit is to convert the heat-transfer state into a second state, wherein heat transfer rate in the second state is lower than the heat transfer rate in the first state.

According to a fourth embodiment, there is provided a supercritical processing method including loading a substrate with a liquid remained thereon on a tray and disposing the substrate on a seating unit within a processing receptacle, tightly closing the processing receptacle, and supplying a processing fluid to a surface of the substrate, and heating the processing fluid via the tray by a heating unit provided below the disposition surface of the seating unit, thereby placing the processing fluid in a supercritical state and performing supercritical processing.

In the present disclosure, a heat-transfer suppressing mechanism for suppressing the heat transfer from a heating unit to a substrate disposed on a seating unit is provided, the heating unit being provided for placing a processing fluid in a supercritical state. Thus, even when the substrate is loaded into a processing receptacle in a state where the heating unit is heated, evaporation of the liquid remained on the substrate is suppressed. This may prevent the pattern formed on the surface of the substrate from being collapsed. Also, in the present disclosure, since there is no need to convert the state of the heating unit into on/off in order to prevent the pattern collapse from occurring, it is possible to quickly increase the temperature of the processing fluid. This contributes to the improvement of throughput. Also, since turning on/off of the heating unit is not frequently carried out, it is possible to extend the life of a switch or a heater. This may prolong the maintenance interval on the parts related to heater the heating unit.

Hereinafter, as one example of a substrate processing system provided with a supercritical processing apparatus according to the present disclosure, a liquid processing system 1 for performing liquid processing on a wafer W (a substrate) by supplying a chemical liquid and performing supercritical drying will be described. FIG. 1 shows a cross-sectional plan view illustrating the entire configuration of liquid processing system 1. When the left side in FIG. 1 is referred to as a front area, liquid processing system 1 includes a carrier seating unit 11 on which a carrier C receiving a plurality of wafers W is seated, a carrying unit 12 for drawing out wafer W from the carrier C and loading it into liquid processing system 1, a transfer unit 13 for transferring wafer W drawn out by carrying unit 12 to a liquid processing unit 14 at the rear area of the system, and liquid processing unit 14 for performing liquid processing and supercritical drying after sequentially loading wafer W transferred from transfer unit 13 in a liquid processing apparatus 2 and a supercritical processing apparatus 3, respectively. The units 11, 12, 13 and 14 are connected to each other in the order above from the front area of the system.

Carrier seating unit 11 is configured as a seating unit capable of seating carriers C (e.g. four (4) carriers), and fixes each carrier C seated on carrier seating unit 11 and connects it with carrying unit 12. Carrying unit 12 has a structure in which an opening/closing device (not shown) for opening/closing an open/close door provided at a surface in contact with each carrier C, and a first carrying device 121 for drawing out wafer W from the carrier C and carrying it to transfer unit 13 are provided within a common case. First carrying device 121 is capable of advancing and retreating in the front and rear directions, and moving in the left and right directions, and includes a rotatable and elevatable carrying arm and a driving unit thereof. First carrying device 121 loads/unloads wafer W in/out of transfer unit 13 via a first opening 122 provided in a partition wall between carrying unit 12 and transfer unit 13.

Transfer unit 13 has a space within a case provided at a position between carrying unit 12 and liquid processing unit 14. A transfer tray 131 for disposing wafer W before/after liquid processing is provided between first opening 122 at the carrying unit 12 side and a second opening 132 provided in the partition wall at the liquid processing unit 14 side. In transfer tray 131, for example, eight (8) wafers W may be disposed, and transfer tray 131 plays a role as a buffer for temporarily disposing wafer W loaded from the carrying unit 12 side and wafer W unloaded from the liquid processing unit 14 side.

Liquid processing unit 14 includes, within a case connected to the rear end of transfer unit 13, liquid processing apparatus 2 for performing liquid processing on wafer W, and supercritical processing apparatus 3 for removing a processing liquid remained on wafer W by the liquid processing. A carrying path 142 for wafer W is provided within liquid processing unit 14, and carrying path 142 extends in a front-rear direction from the above mentioned second opening 132 provided in the partition wall between liquid processing unit 14 and transfer unit 13. For example, six (6) liquid processing apparatuses 2 are provided at the left side from the perspective of second opening 132 in a row along carrying path 142, and, for example, six (6) supercritical processing apparatuses 3 are provided at the right side in a row along carrying path 142 while facing the row of liquid processing apparatuses 2.

A second carrying device 141 is provided within carrying path 142. Second carrying device 141 is capable of moving along carrying path 142, and advancing and retreating toward liquid processing apparatuses 2 and supercritical processing apparatuses 3, respectively, provided on the left and right sides of carrying path 142, and includes a rotatable and elevatable carrying arm and a driving unit thereof. Second carrying device 141 can carry wafer W between the above mentioned transfer tray 131, liquid processing apparatuses 2, and supercritical processing apparatuses 3. Although one second carrying device 141 is provided in FIG. 1, liquid processing unit 14 may include two or more second carrying devices 141 according to the number of provided liquid processing apparatuses 2.

Figure 2:
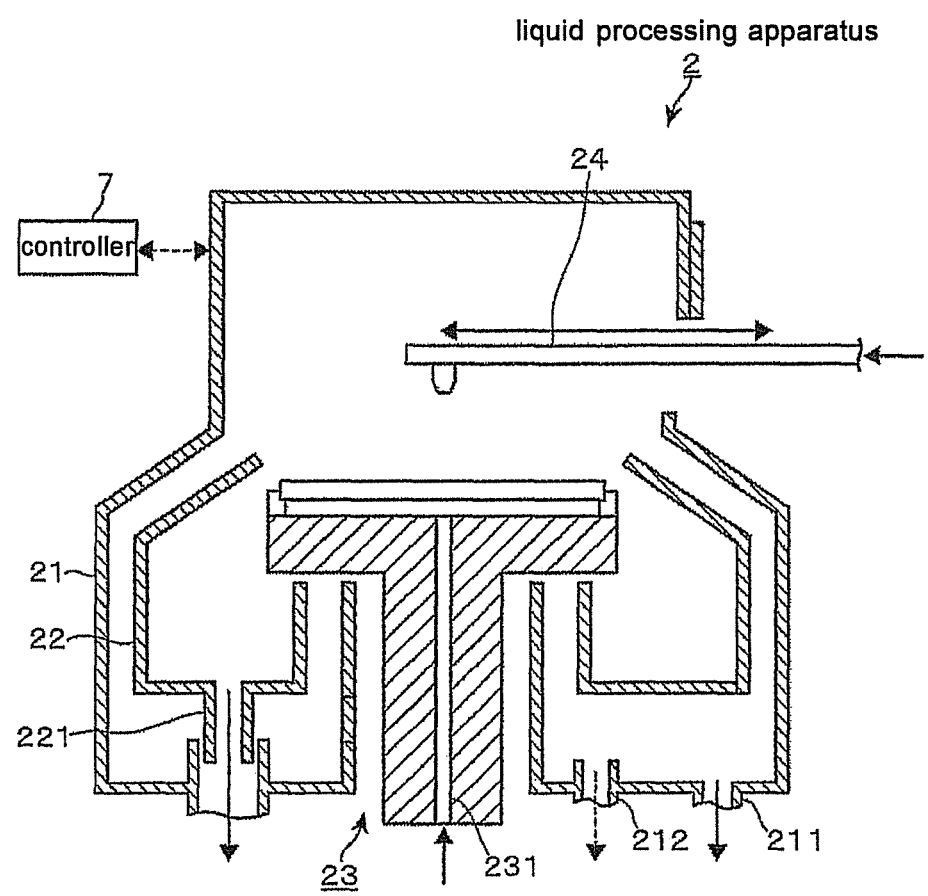
FIG. 2 is a vertical-sectional side view illustrating the configuration of a liquid processing apparatus provided in the liquid processing system.

As shown in FIG. 2, liquid processing apparatus 2 includes an outer chamber 21, a wafer supporting means 23, a nozzle arm 24, and an inner cup 22. Outer chamber forms an enclosed processing space in which liquid processing and rinsing are performed, respectively, on wafer W. Wafer supporting means 23, which is provided within outer chamber 21, rotates wafer W while nearly horizontally supporting wafer W. Nozzle arm 24 supplies a chemical liquid to the upper surface side of wafer W supported by wafer supporting means 23. Inner cup 22, which is provided within outer chamber 21 in such a manner that it can surround wafer supporting means 23, receives the chemical liquid scattered from the rotating wafer W to the vicinity.

Outer chambers 21 are provided in separate cases from adjacent liquid processing apparatuses 2 shown in FIG. 1, and wafer W is loaded/unloaded by second carrying device 141 via a wafer loading/unloading hole (not shown). In the drawings, the reference numeral 211 denotes a drain hole for discharging a chemical liquid reservoired at the bottom portion of outer chamber 21, and the reference numeral 212 denotes an exhaust hole for the exhaust of the inside of outer chamber 21.

Wafer supporting means 23 is configured to supply, to the lower surface of a rotating wafer W, a SC1 liquid (ammonia-hydrogen peroxide solution) as an alkaline chemical liquid for removing particles or organic polluting substances on the surface of wafer W, diluted hydrofluoric acid (hereinafter, referred to as a DHF liquid) as an acidic chemical liquid for removing a natural oxide film on wafer W surface, and pure water for rinsing off these chemical liquids, via a chemical liquid supply path 231 formed within wafer supporting means 23.

Nozzle arm 24 includes, at the leading end portion, a nozzle for supplying a chemical liquid. From the nozzle, isopropyl alcohol (hereinafter, referred to as IPA), together with the above mentioned SC1 liquid, the DHF liquid, and the pure water, may be supplied to the upper surface of wafer W. The IPA is a liquid allowing wafer W to be carried in a state where a liquid remains on wafer W (that is, the surface of wafer W is wet with the liquid) during the carrying of wafer W into supercritical processing apparatus 3. Herein, the liquid, which is supplied to allow wafer W to be carried in a state where the liquid remains on wafer W, may be HFE (hydrofluoroether) that will be described later. Nozzle arm 24 may move the nozzle by a driving means (not shown), between the upper position at the center of wafer W supported by wafer supporting means 23, and the waiting position at the outside of outer chamber 21.

Inner cup 22 is configured to be moved up and down, between a processing position surrounding the wafer supported by wafer supporting means 23, and a retreat position at the lower portion of the processing position. At the bottom portion of inner cup 22, a drain hole 221 for discharging the liquid, which was scattered at the vicinity of wafer W and received at the processing position, is provided.

Hereinafter, the configuration of supercritical processing apparatus 3 will be described in detail with reference to FIGS. 3 to 6. Supercritical processing apparatus 3 includes a processing receptacle 31 for performing a supercritical drying process on wafer W, a bottom plate 32 of processing receptacle 31, a means for receiving wafer W in processing receptacle 31, and another means for supplying a processing liquid to processing receptacle 31 so as to place it in a supercritical state.

Processing receptacle 31 is a flat disk-shaped pressure container for receiving wafer W. Processing receptacle 31 has a concave portion, provided at the bottom surface side thereof, which forms a processing space 30 for performing a supercritical drying process on wafer W. Processing receptacle 31 may be made of stainless steel. The concave portion provided at the bottom surface side of processing receptacle 31 may take a flat disk shape, and forms processing space 30 for receiving wafer W with a diameter of, for example, 300 mm, by combining with a seating unit 321 (which will be described later) for wafer W.

Figure 4:
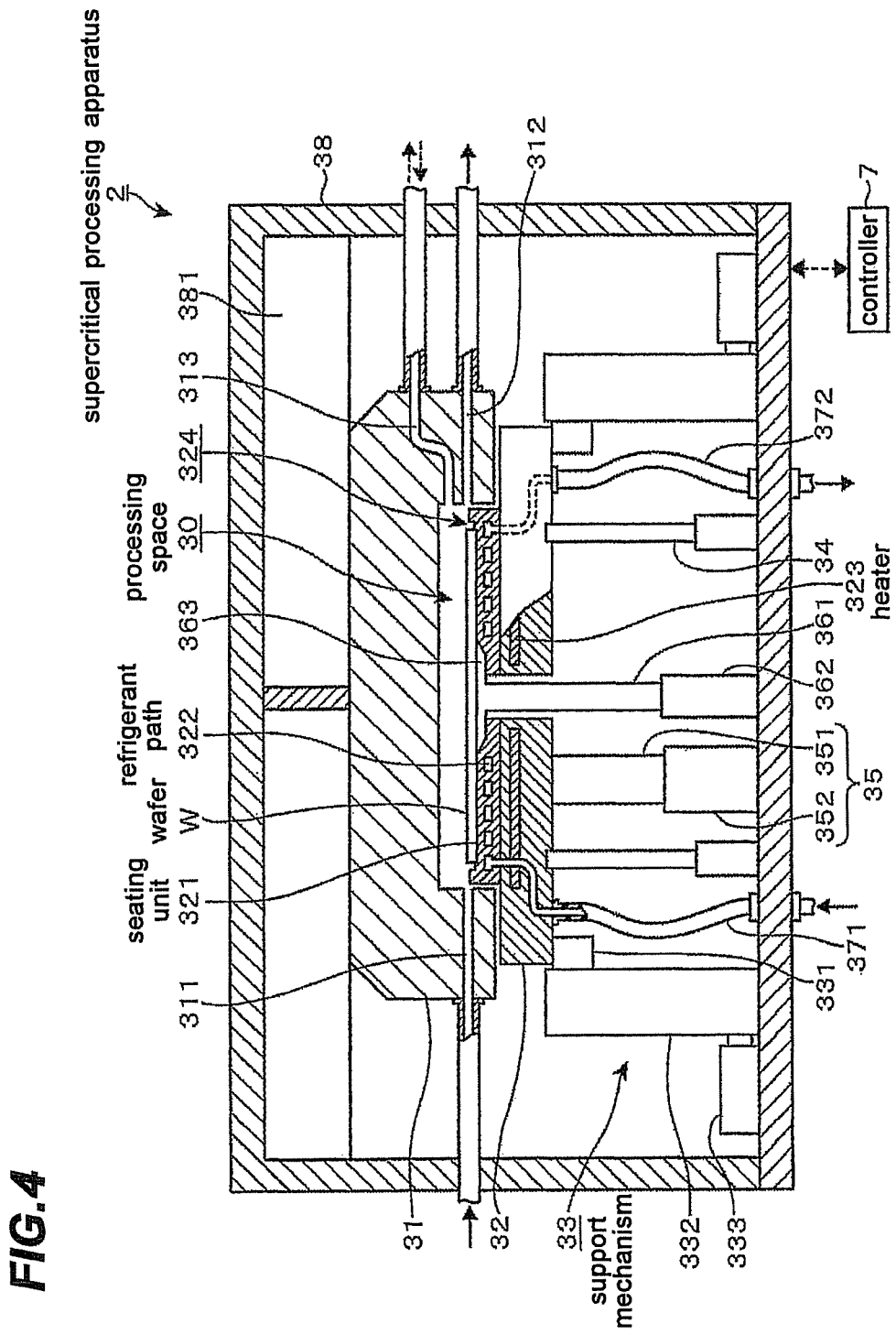
FIG. 4 is a vertical-sectional side view illustrating the configuration of the supercritical processing apparatus.

As shown in FIG. 4, in processing receptacle 31, three paths 311, 312, and 313 which are opened toward the lateral surface of processing space 30 are formed. The reference numeral 311 denotes an HFE supply path for supplying a processing fluid, that is, hydrofluoroether (with a boiling point of, for example, about 70□; hereinafter, referred to as HFE), in a liquid state, into processing space 30. The reference numeral 312 denotes an HFE discharge path for discharging the HFE from processing space 30. The reference numeral 313 denotes an exhaust path for the exhaust from processing space 30. When the HFE is discharged from processing space 30 through exhaust path 313, the inside of processing space 30 may be purged by receiving the atmosphere outside of processing receptacle 31 via exhaust path 313.

Figure 6:
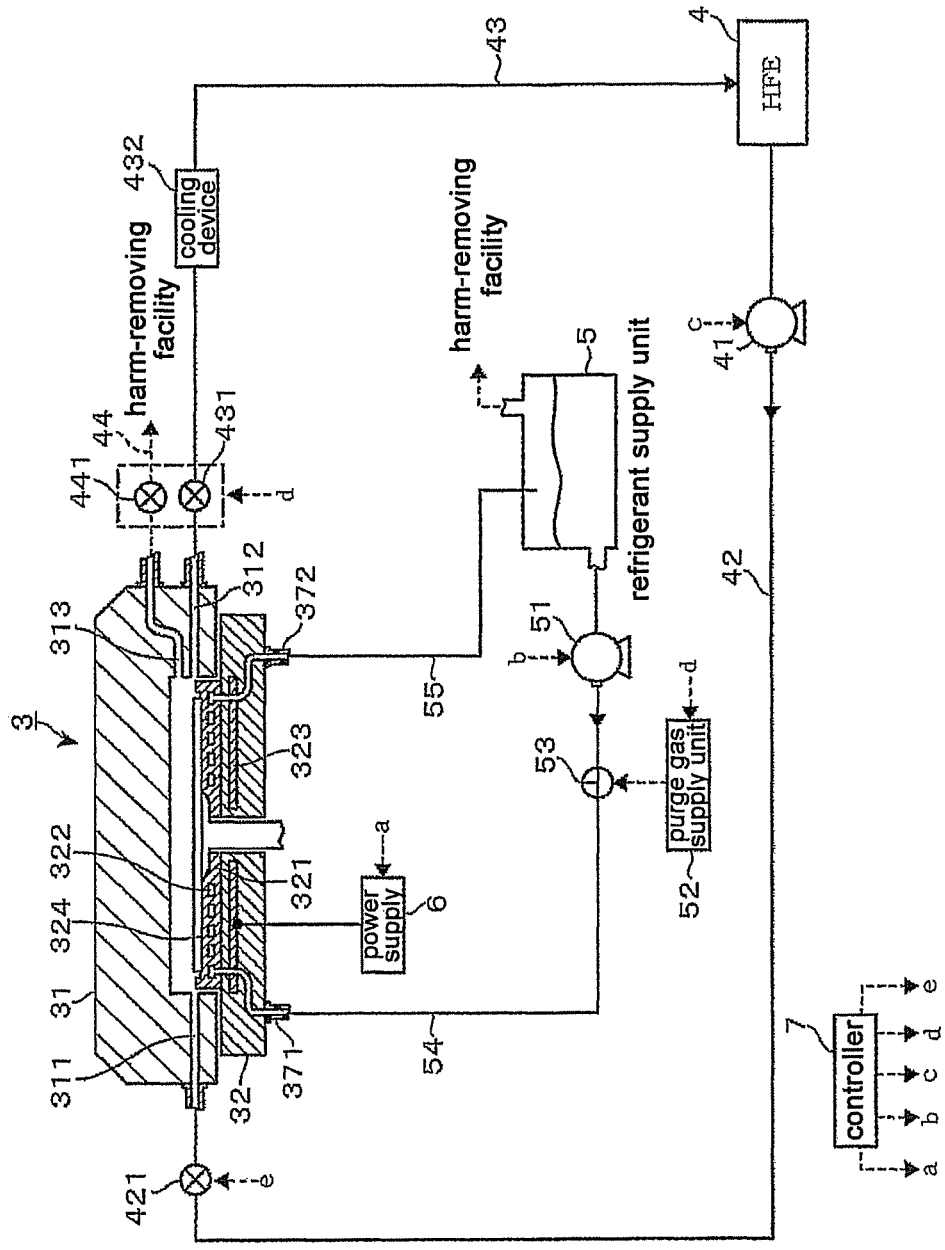
FIG. 6 is an explanatory view illustrating the configuration of the system for supplying a processing fluid and a refrigerant, provided in the supercritical processing apparatus.

HFE supply path 311, as shown in FIG. 6, is connected to an HFE supply unit 4 via an HFE supply line 42 provided between a shutoff valve 421 and a pump 41. Also, HFE discharge path 312 is connected to an HFE discharge line 43, and HFE discharge line 43 is connected to HFE supply unit 4 via a shutoff valve 431 so as to recycle the HFE. In HFE discharge line 43, a cooling device 432, which may include a cooler, for cooling the HFE discharged from processing space 30 is provided. Also, at the outlet side of exhaust path 313, an exhaust line 44 is provided via a shutoff valve 441, and exhaust line 44 may be connected to a harm-removing facility of a plant. In the present example, although HFE supply path 311, HFE discharge path 312, and exhaust path 313 are provided in processing receptacle 31, these paths 311, 312, and 313 may be provided in bottom plate 32 side.

Figure 3:
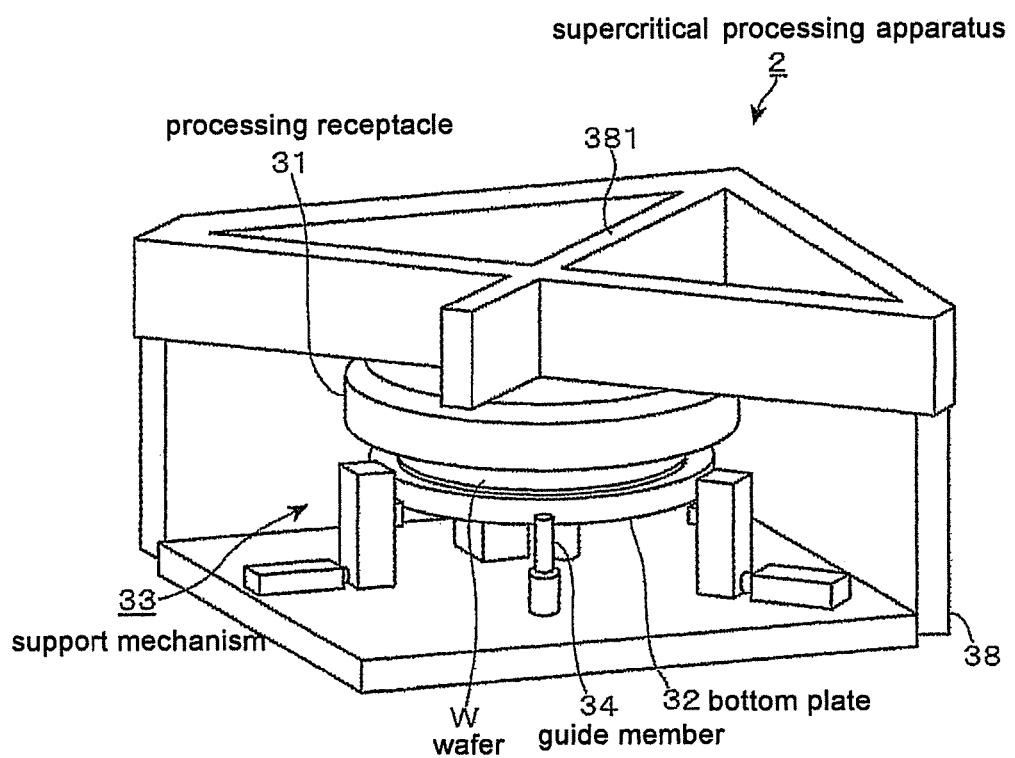
FIG. 3 is a perspective view illustrating the external configuration of a supercritical processing apparatus provided in the liquid processing system.

As shown in FIGS. 4 and 3, processing receptacle 31 is fixed at the upper portion of a case 38 receiving processing receptacle 31 via an X-crossed beam type pressing member 381. Processing receptacle 31 may be pressed downward against the high-pressure force from a supercritical fluid within processing space 30.

Bottom plate 32 forms processing space 30 by closing up the concave portion of processing receptacle 31 at the bottom side, and plays a role of supporting wafer W. Bottom plate 32 may be made of stainless steel, and is formed as a disk-shaped member which is larger than the aperture of the concave portion of processing receptacle 31, by one size, for example. At the upper surface of bottom plate 32, seating unit 321 for wafer W is fixed. Seating unit 321 is made of, for example, stainless steel, and takes a disk shape which can be coupled within the concave portion of processing receptacle 31. As shown in the enlarged plan view of FIGS. 4 and 5, at the upper portion of seating unit 321, a concave portion as a wafer disposition area 324 is formed.

Also, bottom plate 32 is configured to be moved up and down by a bottom plate elevating means 35 including a support rod 351 and a driving unit 352 thereof, and can move between the transfer area at the downward side where wafer W is transferred to/from the above mentioned second carrying device 141, and the processing position for forming processing space 30 by closing up the concave portion of processing receptacle 31 and performing the supercritical drying process on wafer W. In the drawings, the reference numeral 34 denotes a guide member for guiding an elevation path of bottom plate 32 during the elevation, and guide members 34 are disposed at, for example, three positions, nearly equally spaced along the circumferential direction of bottom plate 32.

Herein, the pressure within processing space 30 during the supercritical drying is high, for example, absolute pressure 3 MPa. Since a large downward force is applied on bottom plate 32, a support mechanism 33 for supporting the bottom surface of bottom plate 32 is provided at the lower portion of bottom plate 32. Support mechanism 33 includes a supporting member 331, a guide member 332, and a driving unit 333. Supporting member 331 supports and presses the bottom surface of bottom plate 32 toward the processing receptacle 31 side, and moves up and down according to the elevating operation of bottom plate 32. Guide member 332 forms an elevation path of supporting member 331. Driving unit 333 includes, for example, a hydraulic pump. As shown in FIG. 3, in the same manner as the above described guide members 34, support mechanisms 33 are disposed at, for example, three positions, nearly equally spaced along the circumferential direction of bottom plate 32.

Figure 5:
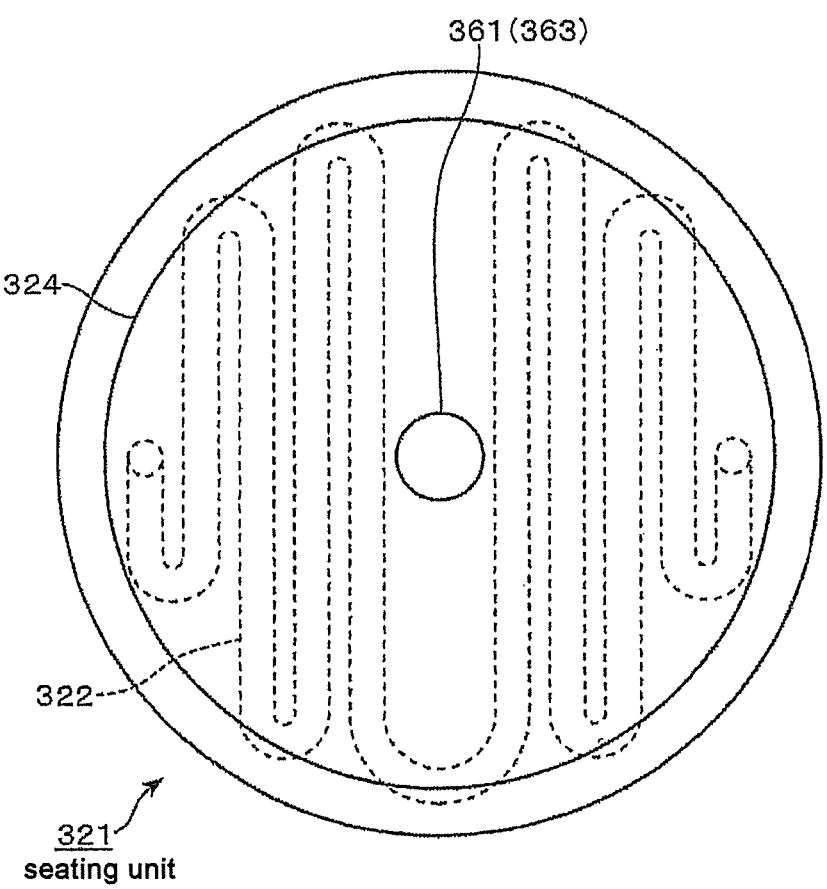
FIG. 5 is a plan view illustrating a configuration example of a seating unit provided in the supercritical processing apparatus.

As shown in FIGS. 4 and 5, at the center portion of bottom plate 32, a lifter 361 for transferring the wafer from/to second carrying device 141 is provided. Lifter 361 passes through nearly the center of bottom plate 32 and seating unit 321 in a top-bottom direction, and has a wafer supporting part 363 fixed at the upper portion thereof and a driving unit 362 provided at the lower portion thereof. Wafer supporting part 363 nearly horizontally supports wafer W, and takes, for example, a disk shape. At the upper surface of seating unit 321, a concave portion for receiving the above described wafer supporting part 363 is formed. Lifter 361 is moved up and down independently from bottom plate 32 so as to project and retract wafer supporting part 363 from bottom plate 32. Thus, wafer W may be transferred between second carrying device 141 and wafer disposition area 324 on bottom plate 32. Herein, as shown in FIG. 4, when being received in the concave portion of bottom plate 32, the upper surface of wafer supporting part 363 is placed in the same plane as the upper surface of seating unit 321, that is, wafer disposition area 324.

Also, within bottom plate 32, a heater 323 including, for example, a heating resistor, is embedded. Heater 323 increases the temperature of the HFE (processing fluid) supplied into processing space 30 up to, for example, 200□, and places the processing fluid in a supercritical state by boosting the inside of processing space 30 up to the above mentioned 3 MPa by using the expansion of the fluid. As shown in FIG. 6, heater 323 is connected to a power supply 6, and heats the processing fluid within processing space 30 via seating unit 321 and wafer W disposed on the upper surface of seating unit 321 by being heated by the electric power supplied from power supply 6.

Herein, supercritical processing apparatus 3 according to the present embodiment is provided with a cooling mechanism which is a heat-transfer suppressing mechanism for inhibiting the occurrence of pattern collapse. Even if heater 323 is placed in an on state, the cooling mechanism prevents the liquid, for example, IPA, remained on the surface of wafer W from being naturally evaporated during the liquid-state supplied HFE is reservoired within processing space 30 and approaches the upper surface of wafer W after wafer W is loaded into processing space 30 and is seated on seating unit 321. Hereinafter, the configuration of the cooling mechanism will be described in detail.

As a cooling mechanism for suppressing the occurrence of pattern collapse, a refrigerant path 322 (a fluid path) is provided within seating unit 321 according to the present embodiment. Refrigerant path 322, as shown in the plan view of FIG. 5, is formed covering almost the entire area of wafer disposition area 324 by meandering within seating unit 321. Refrigerant path 322 absorbs the heat transferred from heater 323 provided at the lower side of seating unit 321 by circulating the refrigerant within refrigerant path 322. Thus, refrigerant path 322 plays a role of maintaining the temperature of wafer disposition area 324 for disposition of wafer W to a temperature that is lower than, for example, the boiling point (82☐) of IPA and does not allow IPA to be naturally evaporated until the start of the supply of HFE.

As shown in FIG. 4, the one end of refrigerant path 322 is connected to a refrigerant supply path 371 while passing through the inside of bottom plate 32, and refrigerant supply path 371 is connected to a refrigerant supply unit 5 via a pump 51, as shown in FIG. 6. In refrigerant supply unit 5, a refrigerant, such as a GALDEN (a registered trademark) liquid, is reservoired. The refrigerant is supplied toward refrigerant path 322, so as to cool the area of refrigerant path 322, that is, the area (heat-transfer surface) between heater 323 and wafer disposition area 324. Refrigerant supply path 371, a refrigerant supply line 54, or refrigerant supply unit 5 is included in the cooling mechanism for the supply of the refrigerant.

Meanwhile, the other end of refrigerant path 322 is connected to a refrigerant discharge path 372 while passing through the side of bottom plate 32, and refrigerant discharge path 372 can recycle the refrigerant by restoring the refrigerant to refrigerant supply unit 5 via a refrigerant discharge line 55. In refrigerant discharge line 55, a cooler for cooling the refrigerant discharged from refrigerant path 322 may be provided. Also, the above described refrigerant supply path 371 and the above described refrigerant discharge path 372, connected to refrigerant path 322, may include, for example, a flexible tube, or the like, and may be transformed according to the elevation of bottom plate 32.

Also, in refrigerant supply line 54, in the downstream area of pump 51, a purge gas supply unit 52 is provided via, for example, a 3-directional valve 53. Purge gas supply unit 52 supplies a purge gas, such as nitrogen gas or atmosphere, instead of the refrigerant, to refrigerant path 322 via refrigerant supply line 54. The purge gas is a purge fluid having a specific heat lower than the refrigerant, and is for extracting the refrigerant from refrigerant path 322. The purge gas supplied to refrigerant path 322 is also discharged to refrigerant supply unit 5 via refrigerant discharge line 55, and is exhausted via an exhaust hole provided in refrigerant supply unit 5, independently from the refrigerant. Accordingly, the fluid supplied to refrigerant path 322 is replaced by the purge gas having a lower specific heat, and the heat supplied from heater 323 is transferred to wafer W side via seating unit 321. Also, the processing fluid within processing space 30 is heated through the upper surface of wafer W and then is placed in a supercritical state.

As described above, in the present embodiment, it is possible to alternately supply the refrigerant or the purge gas into refrigerant path 322. Herein, the state where the refrigerant is discharged by the purge gas corresponds to a first state for heating the processing fluid, and the state where the refrigerant is supplied corresponds to a second state for preventing the chemical liquid remained on wafer W from evaporating. Also, the above mentioned cooling mechanism, 3-directional valve 53, or purge gas supply unit 52 is included in a heat-transfer state converting mechanism of the present embodiment.

Also, in liquid processing system 1, as shown in FIGS. 1, 2, and 4, a controller 7 is connected. Controller 7 includes a computer (not shown) provided with a CPU and a memory unit. In the memory unit, a program having a group of controlling steps (commands) for the operation of liquid processing system 1 is stored. The operation of liquid processing system 1 includes sequential loading of wafer W into liquid processing apparatus 2 or supercritical processing apparatus 3, liquid processing by liquid processing apparatus 2, supercritical drying by supercritical processing apparatus 3, and unloading of wafer W. This program is stored in a memory medium, such as a hard disk, a compact disk, a magneto-optical disk, a memory card, and the memory medium is provided in a computer.

Hereinafter, the operation of liquid processing system 1 according to the present embodiment, with the above described configuration, will be described. At the start of the processing in liquid processing system 1, first carrying device 121 draws out wafer W from the carrier C disposed in carrier seating unit 11, and sequentially disposes it in transfer tray 131 within transfer unit 13.

Second carrying device 141 advances into one of liquid processing apparatuses 2 shown in FIGS. 1 and 2, and transfers wafer W to wafer supporting means 23. After the loading of wafer W into liquid processing apparatus 2, nozzle arm 24 is moved to the position above the center of wafer W, and inner cup 22 is moved up to the processing position. Then, wafer supporting means 23 rotates wafer W while the SC1 liquid is supplied to the upper and lower surfaces of wafer W from the nozzle of the nozzle arm 24 side and chemical liquid supply path 231 of the wafer supporting means 23 side. Accordingly, on the upper and lower surfaces of wafer W, a film of a chemical liquid is formed, and thereby alkaline chemical liquid washing is performed.

When the alkaline chemical liquid washing is completed, inner cup 22 is moved to the retreat position. Then, pure water is supplied to nozzle arm 24 and chemical liquid supply path 231 of wafer supporting means 23 so as to perform a rinsing process for removing the SC1 liquid on the surface of wafer W.

After the completion of the rinsing process and spin-drying, inner cup 22 is moved up again to the processing position. Then, the DHF liquid is supplied to the upper and lower surfaces of wafer W from the nozzle of nozzle arm 24 and chemical liquid supply path 231 of wafer supporting means 23 while wafer W is rotated. Accordingly, on these surfaces of wafer W, a liquid film of the DHF liquid is formed, and thereby acidic chemical liquid washing is performed. Then, after a predetermined time, inner cup 22 is moved down to the retreat position. Next, the supply system for the chemical liquid is converted into a pure water supply mode, and a rinsing process is performed again.

After the rinsing process, inner cup 22 is moved up to the processing position. IPA is supplied to the upper surface of wafer W while wafer W is rotated, and then the rinsing liquid (pure water) on wafer W is substituted by IPA. Then, the liquid processing is completed. Wafer W, on which the liquid processing has been completed, is unloaded from liquid processing apparatus 2 by second carrying device 141, and is loaded into supercritical processing apparatus 3. Then, supercritical drying is performed on IPA, a liquid remained on the surface of wafer W.

Hereinafter, the supercritical drying in supercritical processing apparatus 3 will be described in detail with reference to the flow chart in FIG. 7. First, at the start of liquid processing system 1 (start), supercritical processing apparatus 3 heats heater 323 by turning on it, and flows the refrigerant through refrigerant path 322 of seating unit 321. Thus, seating unit 321 is placed in a stand-by mode in a cooled state (second state) (S101).

Figure 8:
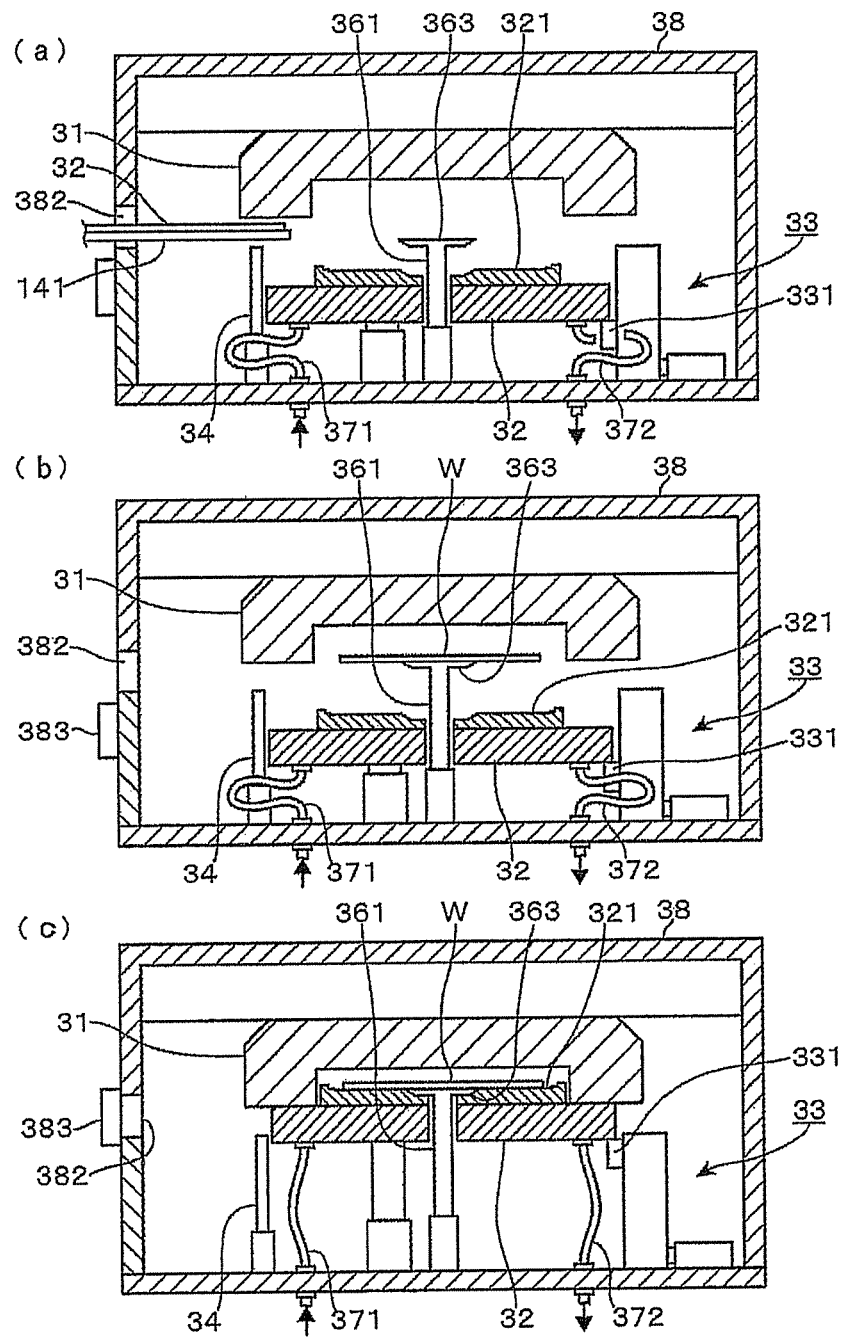
FIG. 8 is an explanatory view illustrating the operations for loading a wafer into the supercritical processing apparatus.

Wafer W, which has been subjected to the liquid processing in liquid processing apparatus 2, is loaded by second carrying device 141 via a loading/unloading hole 382 provided in the lateral side of case 38 (S102) into supercritical processing apparatus 3 in the stand-by mode in the cooled state. Herein, the IPA (liquid) remains on the surface of wafer W. In supercritical processing apparatus 3, as shown in FIG. 8(a), bottom plate 32 is retreated downward, and lifter 361 is placed in a stand-by mode in such a manner that the upper surface of wafer supporting part 363 can be positioned at the downward side of the carrying route of wafer W. Herein, supporting member 331 of support mechanism 33 moves down according to the retreat of bottom plate 32, and refrigerant supply path 371 and refrigerant discharge path 372 are transformed according to the retreat position of bottom plate 32. For the convenience of the illustration, FIGS. 8a to 8c show only one support mechanism 33 and only one guide member 34.

When the center of wafer W disposed on the carrying arm of second carrying device 141 reaches above lifter 361, lifter 361 is moved up and is exchanged with the carrying arm as shown in FIG. 8b. Then, wafer W is supported on wafer supporting part 363, and the carrying arm is retreated to the outside of case 38. Next, as shown in FIG. 8c, bottom plate 32 is moved up by the guiding of guide member 34, thereby receiving wafer supporting part 363 of lifter 361 within the concave portion of seating unit 321, and disposing wafer W on seating unit 321. Then, seating unit 321 is coupled with the aperture of processing receptacle 31 so as to receive wafer W within processing space 30 (S103 in FIG. 7). Herein, supporting member 331 of support mechanism 33 is moved up according to the operation of bottom plate 32, thereby supportedly fixing the bottom surface of bottom plate 32.

During these operations, as described above, even though heater 323 is heated, the heat from heater 323 is absorbed by the refrigerant because the refrigerant flows in refrigerant path 322 of seating unit 321. For this reason, the heat from heater 323 can hardly reach wafer disposition area 324 of wafer W. Also, the atmosphere within case 38 where wafer W is loaded, or the temperature of wafer disposition area 324 is maintained lower than, for example, the boiling point of IPA. As a result, while wafer W is loaded into supercritical processing apparatus 3 and then is disposed on seating unit 321, the evaporation of IPA is suppressed. This can suppress the occurrence of pattern collapse.

Figure 9:
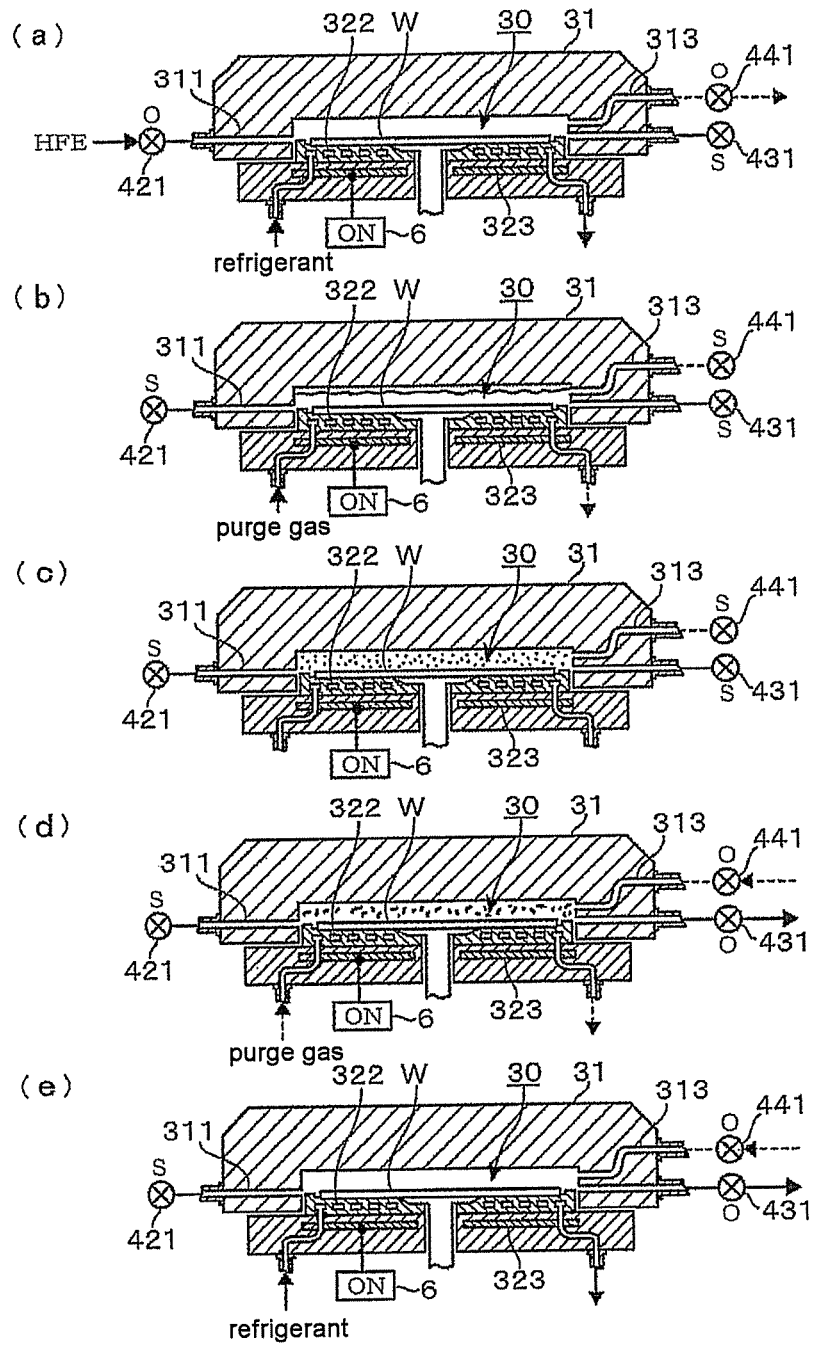
FIG. 9 is an explanatory view illustrating the operations for supercritically drying a wafer by the supercritical processing apparatus.

As shown in FIG. 9a, shutoff valves 421 and 441 of HFE supply path 311 and exhaust path 313 are opened ($[^O$ in the drawing), and HFE is supplied from HFE supply path 311 into processing space 30. Then, the atmosphere within processing space 30 is discharged from exhaust path 313 so as to exchange the atmosphere within processing space 30 with HFE (S104 in FIG. 7). When the liquid level of the HFE within processing space 30 reaches the upper surface of wafer W, the surface of wafer W is wet. In this state, pattern collapse does not occur even if wafer W is heated. Thus, as shown in FIG. 9b, the supply of the refrigerant into refrigerant path 322 is stopped, the inside of refrigerant path 322 is exchanged with a purge gas, and the supply of the purge gas is stopped (S105). When the HFE reaches the upper surface of wafer W, the IPA remained on the wafer surface is dissolved in the HFE.

As a result, the fluid within refrigerant path 322 is exchanged with the purge gas having a specific heat lower than the refrigerant (the first state). Also, since the purge gas stays within refrigerant path 322, the heat supplied from heater 323 is hardly discharged via refrigerant path 322, but is transferred toward wafer disposition area 324 of wafer W. The heat transferred to wafer disposition area 324 is supplied to the HFE via wafer W, thereby increasing the temperature of the HFE.

Figure 7:
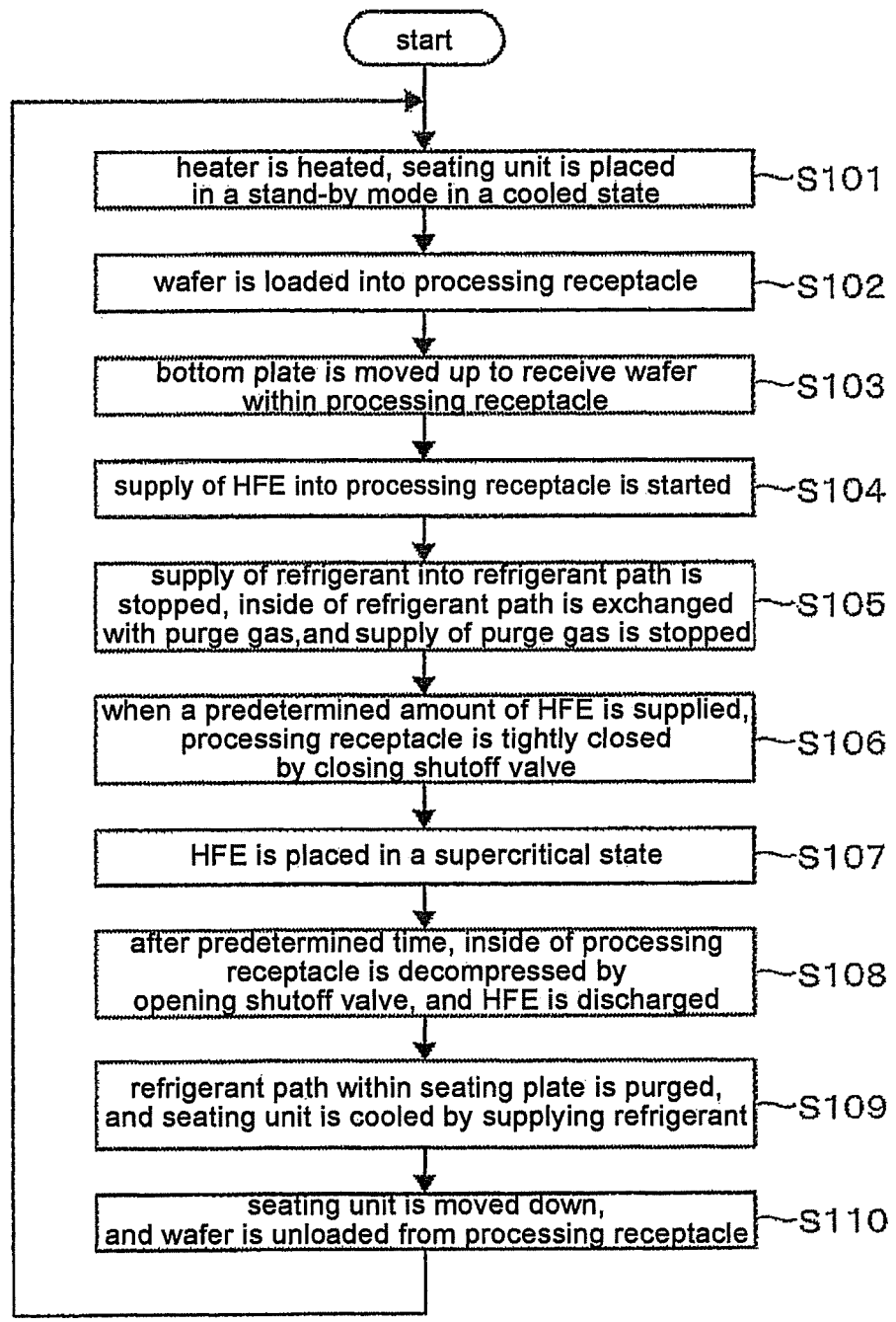
FIG. 7 is a flow chart illustrating the flow of operations in the supercritical processing apparatus.

Next, when the HFE is supplied into processing space 30 in a predetermined amount, for example, about 80% of the capacity of processing space 30, shutoff valves 421, 431, and 441 of HFE supply path 311, HFE discharge path 312, exhaust path 313 a closed ($[^S$ in FIG. 9c), thereby tightly closing processing space 30 within processing receptacle 31 (S106 in FIG. 7). The HFE is continuously heated within tightly closed processing space 30. As the temperature of the HFE is increased, the HFE is expanded and then is placed in a supercritical state (S107 in FIGS. 9c, and 7).

After a predetermined time, as shown in FIG. 9d, shutoff valves 431, and 441 of HFE discharge path 312, and exhaust path 313 are opened, thereby decompressing the inside of processing space 30. This discharges the HFE from processing space 30 (S108 in FIG. 7). Herein, the HFE is discharged in the supercritical state from processing space 30, or the HFE is discharged in a gas state at a temperature higher than a boiling point (for example, at 200□) even if the pressure within processing space 30 is reduced. Thus, a surface tension is hardly applied on the surface pattern of wafer W, and thereby the HFE can be discharged without pattern collapse. The IPA remained on the surface of wafer W is dissolved in the HFE, and is discharged, together with the HFE, from processing space 30 (otherwise, in the gas state, a mixed gas of IPA and HFE is discharged). In other words, after the supply of the HFE in a liquid state to the surface of wafer W, the IPA previously remained on the surface of wafer W (in S108) is removed, and also the HFE (processing fluid) supplied in the liquid state is removed.

When the HFE is discharged, as shown in FIG. 9d, the inside of refrigerant path 322 is purged by the purge gas, thereby reducing the temperature within refrigerant path 322. Then, as shown in FIG. 9e, the liquid supplied into refrigerant path 322 is exchanged with the refrigerant, thereby cooling seating unit 321 (S109 in FIG. 7). Through these operations, the supercritical drying on wafer W is completed, and then wafer W is unloaded from supercritical processing apparatus 3 in reverse order to that of the loading operation (S110 in FIG. 7).

After wafer W drawn out from supercritical processing apparatus 3 is carried to transfer tray 131 by second carrying device 141, wafer W is drawn out by first carrying device 121, and then is received within the carrier C of carrier seating unit 11. Through the repetition of these operations, liquid processing system 1 can perform washing and drying processes on a plurality of wafers W while both the liquid processing process and the supercritical drying process are carried out in liquid processing apparatus 2 and supercritical processing apparatus 3.

According to liquid processing system 1 according to the present embodiment can achieve the following advantages. Although heat is transferred to seating unit 321 from heater 323 provided for placing the HFE in a supercritical state, there is provided a cooling mechanism [refrigerant path 322, refrigerant supply unit 5, pump 51, and refrigerant supply line 54] for force-cooling the seating unit 321 (which is an area for transferring the heat to wafer W disposed thereon). Accordingly, when wafer W is loaded into processing receptacle 31 while heater 323 is turned on, the evaporation of IPA (liquid) remained on wafer W is suppressed by the preceding liquid processing. This can suppress the pattern formed on the surface of wafer W from being collapsed. Also, since there is no need to convert the state of heater 323 into on/off in order to prevent the pattern collapse from occurring, the temperature of bottom plate 32 with heater 323 embedded therein is not reduced, and it is possible to quickly increase the temperature of HFE. This contributes to the improvement of throughput. Also, since turning on/off of heater 323 is not frequently carried out, the maintenance interval on the parts related to heater 323, such as a switch, may be prolonged.

Figure 10:
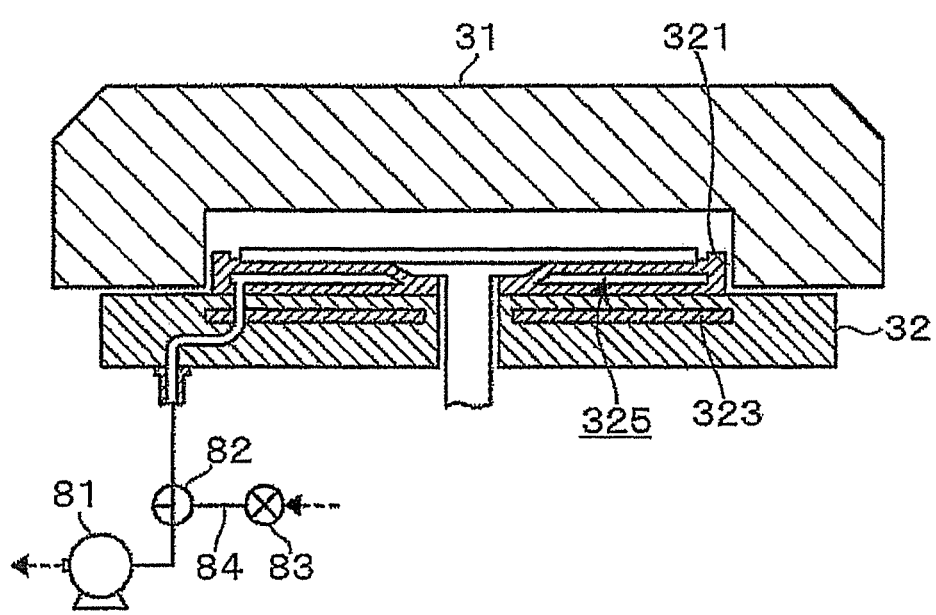
FIG. 10 is a vertical-sectional side view illustrating the configuration of a supercritical processing apparatus according to another embodiment.

Herein, the configuration of a heat-transfer state converting mechanism for converting seating unit 321 into a first state for heating the HFE (processing fluid) or a second state for preventing the liquid (chemical liquid) remained on wafer W from being evaporated is not limited to the mechanism for alternately supplying the refrigerant or the purge gas into refrigerant path 322, shown in the above described embodiment. For example, in another embodiment, as shown in FIG. 10, an inhalation line 84 which is configured to be opened to the atmosphere and to be opened/closed by a shutoff valve 83, and a vacuum pump 81 may be connected to a fluid path within seating unit 321 via a 3-directional valve 82. Thus, the heat from heater 323 may be vacuum heat-insulated by opening the fluid path to the atmosphere via inhalation line 84 in a first state for heating HFE, and vacuum-exhausting the inside of the fluid path by vacuum pump 81 in a second state for preventing a chemical liquid from being evaporated. In this case, the fluid path within seating unit 321 is a vacuum heat-insulating space 325.

Figure 11:
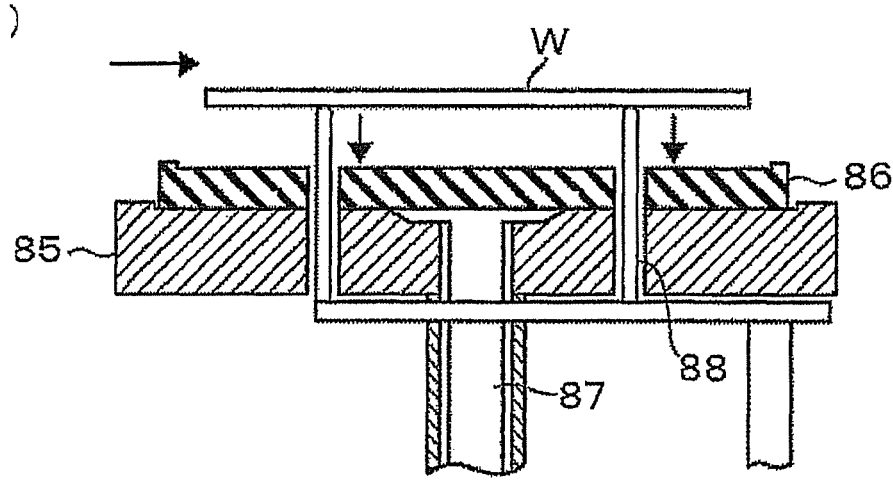
FIG. 11 is an explanatory view illustrating the operations for disposing a wafer on a tray in a supercritical processing method according to a further embodiment.
Figure 11:
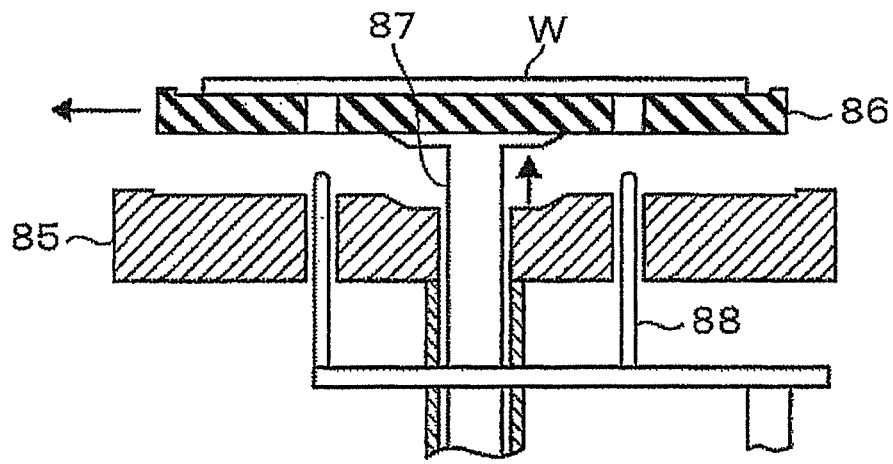
Figure 12:
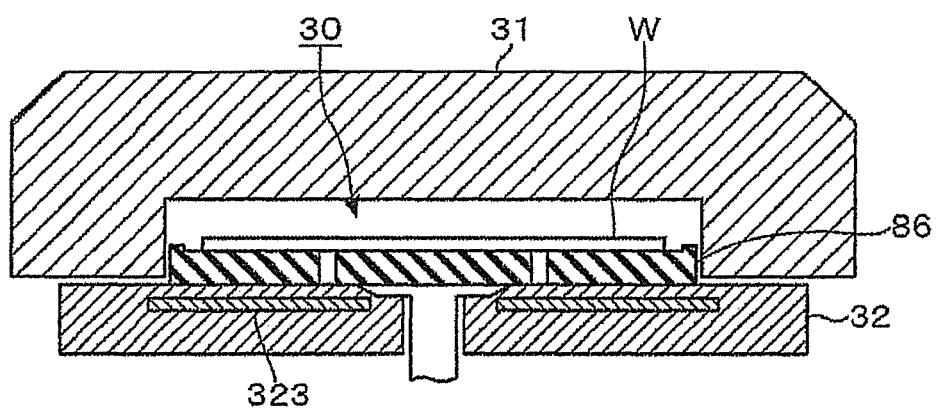
FIG. 12 is an explanatory view illustrating the operation of supercritical processing using the tray according to the further embodiment.

Also, in a further embodiment, besides liquid processing apparatus 2 and supercritical processing apparatus 3, a module for transferring wafer W with a liquid (such as IPA) remained thereon to a tray after liquid processing may be provided within liquid processing unit 14 shown in FIG. 1. As shown in FIGS. 11a, and 11b, within such a module for transferring the wafer to the tray, a tray 86, to which wafer W is to be disposed, is disposed on a seating unit 85 in a stand-by mode, and wafer W drawn out from liquid processing apparatus 2 by second carrying device 141 is disposed on tray 86 by a pin 88 for transferring wafer W within the module, as shown in FIG. 11a. Then, tray 86 with wafer W disposed thereon is moved up by lifter 87, and is transferred to the carrying arm of second carrying device 141 again. Second carrying device 141 disposes wafer W on bottom plate 32 in a state where wafer W is loaded in tray 86, and a supercritical drying process starts.

In this embodiment, since heat from heater 323 is transferred to wafer W via tray 86, it takes time to transfer the heat to wafer W. Thus, during that time, HFE is supplied into processing space 30, and then a supercritical drying process by the HFE starts before the liquid remained on wafer W is naturally dried. This may prevent the pattern from being collapsed.

Besides, although in the above described embodiments, heater 323 is provided within bottom plate 32 below the disposition area of wafer W, the position where heater 323 is provided is not limited thereto. For example, a heating unit, such as a heater, may be provided at the lateral side of processing receptacle 31, or at processing receptacle 31's top side opposed to seating unit 321. In this case, a cooling mechanism with refrigerant path 322 formed therein may be provided in the lateral wall or the ceiling of processing receptacle 31 between the heater disposition area and wafer W on the disposition area, thereby preventing the liquid remained on wafer W from being evaporated Also, the processing fluid used for a supercritical drying process is not limited to the above described HFE. For example, liquefied $CO_2$ may be used. In this case, after liquid processing, wafer W wet with liquefied $CO_2$ or IPA is carried, and received in processing space 30. Then, liquefied $CO_2$ is supplied, and a supercritical drying process is performed by heating the liquefied $CO_2$. In the case where the liquefied $CO_2$ is to be placed in a supercritical state, the parameters include a liquefied $CO_2$ temperature of, for example, 35□, and a processing space 30 inside pressure of, for example, 7.5 MPa.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A supercritical processing apparatus comprising:
    a processing receptacle having a seating unit configured to dispose a substrate with a drying liquid remained thereon from a previous process;
    a processing fluid supply unit configured to supply a processing fluid into the processing receptacle;
    a heating unit provided below a disposition surface of the seating unit and configured to heat the processing fluid supplied into the processing receptacle in order to place the processing fluid in a supercritical state;
    a heat-transfer suppressing mechanism having a refrigerant path provided within the seating unit such that the refrigerant path is positioned directly below the disposition surface of the seating unit where the substrate is disposed but directly above the heating unit such that heat from the heating unit to the substrate can be absorbed; and
    a controller configured to control an overall operation of the supercritical apparatus including the heat-transfer suppressing mechanism,
    wherein the controller is programmed to control the heat-transfer suppressing mechanism to be switched between a first state where the heat from the heating unit is transferred to the substrate without being absorbed and a second state where the heat from the heating unit is absorbed thereby suppressing a heat transfer to the substrate while the heating unit is continuously turned ON.

2. The supercritical processing apparatus as claimed in claim 1, wherein the heat-transfer suppressing mechanism is a cooling mechanism to forcibly cool an area transferring the heat from the heating unit to the substrate.

3. The supercritical processing apparatus as claimed in claim 1, wherein the heating unit is provided below a disposition surface of the seating unit, and the supercritical processing apparatus further comprises a heat-transfer state converting mechanism to convert a heat-transfer state of a heat-transfer surface between the disposition surface and the heating unit into the first state for heating the processing fluid by the heating unit during processing on the substrate, and to convert the heat-transfer state into the second state for preventing the liquid from evaporating from the substrate during an interval from completion of the processing on the substrate to disposition of another substrate on the seating unit, wherein the heat transfer rate in the second state is lower than the heat transfer rate in the first state, wherein the heat-transfer state converting mechanism is also used as the heat-transfer suppressing mechanism.

4. The supercritical processing apparatus as claimed in claim 3, wherein the heat-transfer state converting mechanism comprises a fluid path provided in the seating unit, a refrigerant supply unit to supply a refrigerant to the fluid path to convert the heat-transfer state into the second state, and a purge fluid supply unit to supply a purge fluid having a specific heat lower than the refrigerant to the fluid path to convert the heat-transfer state into the first state.

5. The supercritical processing apparatus as claimed in claim 4, wherein the purge fluid supply unit fills the fluid path with the purge fluid, and then stops through-flow of the purge fluid.

6. The supercritical processing apparatus as claimed in claim 3, wherein conversion from the second state into the first state is performed after the processing fluid supplied from the processing fluid supply unit into the processing receptacle is reservoired up to a level higher than an upper surface of the substrate disposed on the seating unit.

7. A substrate processing system comprising:

a liquid processing apparatus to supply a chemical liquid to a surface of a substrate and wash the surface;

a supercritical processing apparatus, as claimed in claim 1, to perform processing on the substrate loaded into a processing receptacle from the liquid processing apparatus by a supercritical-state processing fluid; and a substrate carrying device to carry the substrate between the liquid processing apparatus and the supercritical processing apparatus.

8. The supercritical processing apparatus of claim 1, wherein a purge gas is supplied to the heat-transfer suppressing mechanism in the first state, and a refrigerant is supplied to the heat-transfer suppressing mechanism in the second state.

* * * * *